United States Patent
Hettler et al.

(10) Patent No.: US 11,256,048 B2
(45) Date of Patent: Feb. 22, 2022

(54) TRANSISTOR OUTLINE PACKAGE WITH GLASS FEEDTHROUGH

(71) Applicant: SCHOTT AG, Mainz (DE)

(72) Inventors: Robert Hettler, Kumhausen (DE); Artit Aowudomsuk, Bangkok (TH); Kenneth Tan, Singapore (SG); Karsten Droegemueller, Eichenau (DE)

(73) Assignee: SCHOTT AG, Mainz (DE)

( * ) Notice: Subject to any disclaimer, the term of this patent is extended or adjusted under 35 U.S.C. 154(b) by 2 days.

(21) Appl. No.: 16/552,669

(22) Filed: Aug. 27, 2019

(65) Prior Publication Data
US 2020/0064572 A1 Feb. 27, 2020

(30) Foreign Application Priority Data
Aug. 27, 2018 (DE) .................... 10 2018 120 893.6

(51) Int. Cl.
| | |
|---|---|
| *G02B 6/42* | (2006.01) |
| *H04B 10/572* | (2013.01) |
| *H01S 5/02212* | (2021.01) |
| *H01B 17/30* | (2006.01) |

(52) U.S. Cl.
CPC ......... *G02B 6/4263* (2013.01); *G02B 6/4214* (2013.01); *H01B 17/305* (2013.01); *H01S 5/02212* (2013.01); *H04B 10/572* (2013.01)

(58) Field of Classification Search
CPC .. G02B 6/4263; G02B 6/4214; H01B 17/305; H01S 5/02212; H04B 10/572
USPC .......................................................... 385/92
See application file for complete search history.

(56) References Cited

U.S. PATENT DOCUMENTS

| | | |
|---|---|---|
| 4,951,011 A | 8/1990 | Heckaman |
| 5,557,074 A | 9/1996 | Miyamoto |
| 5,952,716 A | 9/1999 | Dibble |
| 8,038,049 B2 | 10/2011 | Tzviskos |
| 8,908,728 B1 * | 12/2014 | Huikai ................ H01S 5/02415 372/34 |
| 2001/0026991 A1 | 10/2001 | Ichikawa |
| 2003/0218923 A1 | 11/2003 | Giaretta |
| 2005/0111503 A1 * | 5/2005 | Ishigami ............. H01S 5/02212 372/38.1 |
| 2005/0201433 A1 | 9/2005 | Riaziat |
| 2009/0135864 A1 * | 5/2009 | Aruga .................. H05K 1/0243 372/29.02 |

(Continued)

FOREIGN PATENT DOCUMENTS

| | | |
|---|---|---|
| CN | 1313661 | 9/2001 |
| CN | 1452283 | 10/2003 |

(Continued)

*Primary Examiner* — Jerry M Blevins
(74) *Attorney, Agent, or Firm* — Ohlandt, Greeley, Ruggiero & Perle, L.L.P.

(57) ABSTRACT

A transistor outline package is provided that includes a header with a mounting area for an optoelectronic component. The header has a signal pin disposed in a feedthrough. The feedthrough is filled with an insulating material made of glass and/or glass ceramic. The feedthrough has a recessed area on at least one side that is not completely filled up with the insulating material. The recessed area defines a cavity at least partially around the signal pin and the signal pin has an enlarged portion in the recessed area.

21 Claims, 15 Drawing Sheets

(56) References Cited

U.S. PATENT DOCUMENTS

| | | | |
|---|---|---|---|
| 2009/0242926 A1 | 10/2009 | Kimura | |
| 2010/0008093 A1 | 1/2010 | Lin | |
| 2010/0252856 A1* | 10/2010 | Yuang | H01S 5/02296 257/99 |
| 2014/0029900 A1* | 1/2014 | Logan, Jr. | G02B 6/3821 385/92 |
| 2014/0217570 A1 | 8/2014 | Hettler | |
| 2014/0241388 A1 | 8/2014 | Yamanaka | |
| 2015/0083487 A1* | 3/2015 | Leedecke | C03C 3/093 174/659 |
| 2017/0186510 A1 | 6/2017 | Leedecke | |
| 2019/0109102 A1 | 4/2019 | Aowudomsuk | |

FOREIGN PATENT DOCUMENTS

| | | |
|---|---|---|
| CN | 201417884 | 3/2010 |
| CN | 202196767 | 4/2012 |
| CN | 103907249 | 7/2014 |
| CN | 104466520 | 3/2015 |
| DE | 69218122 | 6/1997 |
| DE | 102013114547 | 7/2014 |
| DE | 102017123342 | 4/2019 |
| JP | 2004253419 | 9/2004 |

\* cited by examiner

TRANSISTOR OUTLINE PACKAGE WITH GLASS FEEDTHROUGH

CROSS REFERENCE TO RELATED APPLICATIONS

This application claims benefit under 35 USC 119(a) of German Application 10 2018 120 893.6 filed Aug. 27, 2018, the entire contents of which are incorporated herein by reference.

BACKGROUND

1. Field of the Invention

The invention relates to a transistor outline (TO) package that should enable a high data transfer rate.

2. Description of Related Art

TO packages with glass-sealed signal pins are known. Such a TO package generally comprises a header made of metal, through which at least one signal pin extends which is fitted in a glass feedthrough. The signal pin can be used to electrically connect an optoelectronic component, in particular a laser diode. Glass feedthroughs, in particular fused glass feedthroughs, allow to provide, in a simple manner, hermetically sealed packages with high temperature resistance.

Currently, data transfer rates of 25 Gbit/s per channel are common in the 100 G Internet standard. In order to reach the next Internet standard 400 G, the data transfer rate has to be approximately doubled to achieve about 100 Gbit/s per wavelength.

At the same time, this requires a doubling in the bandwidth and in the transmission frequency.

The region of glass feedthroughs of a TO package is problematic because of the jump in impedance of the signal path that is always caused due to the insulation made of glass which has a different permittivity than air. Such a jump in impedance can be compensated for, for example, by a projection of the signal pin on the lower surface of the package.

Another problem is that the glass potting compound that is used is subject to volume variations. A varying filling volume in particular causes varying meniscus formation at the ends of the glass feedthrough. This may have a negative impact on the desired impedance of the signal path. It is known from practice to push back the meniscus using a carbon sleeve. However, this is very cumbersome.

SUMMARY

The invention is therefore based on the object to provide a TO package which allows for high data rates and in which variations in the filling volume of the insulating material made of glass or glass ceramic have the least possible impact on the impedance profile of the signal path of the TO package, as well as applications of such TO packages.

The TO package comprises a header with a mounting area for an optoelectronic component. It is in particular contemplated that the package comprises a header made of metal, in particular a metal provided with a coating.

The mounting area is provided inside the package. The package may be sealed with a cap which has a window through which electromagnetic radiation can pass.

The header comprises at least one signal pin disposed in a feedthrough, for connecting the optoelectronic component. The optoelectronic component is in particular implemented as a laser diode. The at least one signal pin is used to drive or modulate the optoelectronic component for the purpose of data transfer. The invention in particular relates to a TO package that includes a transmitting diode.

It will be understood that the header may comprise further electrical feedthroughs, in particular those which are used for power supply of components, for driving further components, such as a monitor diode or a thermoelectric cooler, for example.

Since such further feedthroughs either do not serve for data transfer at all, or are used for lower data transfer rates than the signal pins with respect to the optoelectronic component, for example in the case of a monitor diode, the design of such feedthroughs is less problematic with respect to the signal path.

The feedthrough is filled with an insulating material that comprises and in particular consists of glass and/or glass ceramic, in which the signal pin is embedded. The insulating material is in particular provided in the form of a potting compound or compression glass feedthrough, in which the signal pin is arranged.

According to the invention, the feedthrough is not completely filled up with the glass and/or glass ceramic insulating material on at least one side thereof.

Thus, on at least one side of the feedthrough there is an area in which the insulating material made of glass and/or comprising glass ceramic is recessed, so that the insulating material does not extend to the end of the feedthrough at the upper surface or lower surface of the header.

The invention therefore contemplates that the volume of the feedthrough is not completely filled with the insulating material made of glass and/or comprising glass ceramic, but that an area is provided on at least one side below the upper surface or the lower surface of the header, where the feedthrough is not filled with the insulating material made of glass and/or comprising glass ceramic.

In this way it is possible to compensate for volume variations of the insulating material made of glass within the feedthrough. Formation of a meniscus beyond the upper surface or the lower surface of the header can be largely avoided, since the meniscus will be at least partially located in the feedthrough.

It is in particular contemplated that the feedthrough is filled with the insulating material made of glass and/or comprising glass ceramic in 30 to 95%, preferably 50 to 90%, and more preferably 60 to 80% of its volume.

According to one embodiment of the invention, the area in which the insulating material made of glass and/or comprising glass ceramic is recessed may define a cavity around the signal pin. The cavity may in particular represent a deepening in the header whose bottom is formed by insulation material.

This has the effect that the transition of the electromagnetic field from the feedthrough to the signal pin and/or to the signal path to the optoelectronic component within the TO package occurs along an improved impedance profile, in particular a rather gradually changing impedance profile. Due to the cavity, the transition becomes smoother, which reduces loss.

According to another embodiment of the invention, the area of the feedthrough in which no insulating material made of glass and/or comprising glass ceramic is provided is filled up with a plastic, in particular with an epoxy resin.

The filling with a further insulating material made of plastic has the advantage that in this way the recessed area will not be surrounded by air. Air has a permittivity $\varepsilon_r$ of about 1, so that impedance changes abruptly.

This jump can be reduced by using a plastic potting compound.

In terms of process technology it is easier, compared to fused glasses, to fill up the area not filled with the glass insulating material without causing meniscus formation.

For example a plastic can be used which is cured thermally or by light, in particular by UV light.

In particular, a plastic is used which has a permittivity matched with that of the glass. More particularly, a plastic is used that has a permittivity $\varepsilon_r$ (at 18° C. and 50 Hz) which corresponds to the permittivity of the insulating material made of glass +/−1.0.

According to one embodiment of the invention, the plastic has a permittivity $\varepsilon_r$ (at 18° C. and 50 Hz) of 4.0+/−2.5, preferably of 4.0+/−1.5.

According to a preferred embodiment of the invention, the feedthrough is filled with an insulating material made of glass and/or comprising glass ceramic having a low permittivity. It is in particular contemplated that a glass and/or glass ceramic is used which has a permittivity $\varepsilon_r$ (at 18° C. and 50 Hz) of less than 5.0, preferably of less than 4.0.

It has been found that both insertion loss and return loss can be improved in this way.

In particular an insulating material consisting of a porous glass can be used for this purpose. This is in particular a glass having closed-pore gas inclusions. The glass preferably has a closed porosity of at least 5%, most preferably of more than 10%. Despite of the closed-pore implementation, hermetically tight sealing can be achieved. Another possible option includes glass ceramics which have these properties. In particular a glass ceramic in which pores are formed due to the crystallization can be used.

According to another embodiment, a glass or a glass ceramic is used which has a higher permittivity, in particular a permittivity $\varepsilon_r$ between 5.0 and 8, preferably between 6.5 and 7. Such glasses are particularly suitable for compression glass feedthroughs, i.e. feedthroughs in which the glass is under a thermally induced mechanical compressive stress.

A plastic is preferably used to fill the recessed area on the lower side, i.e. the outer side of the feedthrough.

In a further embodiment of the invention, the signal pin has an enlarged portion in the area of the feedthrough in which there is no insulating material made of glass and/or glass ceramic. The portion in which there is no insulating material made of glass or glass ceramic, may in particular be a deepening in the header. The bottom of this deepening then is formed by the surface of the insulation material. In doing so, it is not necessary that the deepening is entirely inside the deepening. It may rather also partially extend into the insulation material.

The enlarged portion may be in the form of a collar or a disk, for example.

The enlarged portion is preferably completely located within the feedthrough.

The enlarged portion has a diameter which is in particular 1.2 to 3.0 times, preferably 1.5 to 2.0 times that of the adjacent signal pin in the glass insulating material.

The enlarged portion or collar is in particular arranged on the inner side.

With the enlarged portion, the ratio of the diameter of the feedthrough to the diameter of the pin changes in the area not filled with insulation material.

In this way it is possible to further reduce the jump in impedance due to the changed permittivity around the signal pin in the area not filled with glass and/or glass ceramic.

In a preferred embodiment of the invention, the enlarged portion has a length $l_e$ of 0.02 to 0.2 mm, preferably 0.05 to 0.1 mm.

In a further embodiment of the invention, the feedthrough has an area of enlarged diameter on at least one side of the feedthrough.

It is in particular contemplated that this area of enlarged diameter is partially filled with the insulating material made of glass.

In particular, the area of enlarged diameter has a diameter that is 1.2 times the diameter of the adjacent feedthrough. Preferably, the area of enlarged diameter has a length from 0.05 to 0.5 mm, most preferably from 0.1 to 0.3 mm.

The area of enlarged diameter also allows to adjust the impedance profile of the signal path. Furthermore, the area of enlarged diameter serves as a volume reservoir for variations in the glass volume.

Preferably, the area of enlarged diameter is partially filled with glass and/or glass ceramic. A possibly forming meniscus does preferably not protrude beyond the upper surface or the lower surface of the header.

In the area not filled with glass or glass ceramic, the area of enlarged diameter is preferably in the form of a cavity or is filled with a material having a lower permittivity than the glass of the insulating material.

In this way, a jump in impedance can be reduced by partially balancing inductance and capacitance. The insulating material partially located in the area of enlarged diameter causes a mismatched disk with regard to the impedance, which at least partially compensates for the impedance jump caused by the adjacent area of the feedthrough that is not filled with insulating material.

In a refinement of the invention, the TO package is connected to a printed circuit board which is attached on the signal pin substantially coaxially thereto.

It has been found that the impedance profile can also be improved by a coaxially arranged printed circuit board.

Preferably, the printed circuit board is mechanically and electrically connected to the header by at least one metal block arranged adjacent to the feedthrough, to provide grounding.

Thus, grounding of the TO package is not implemented via a grounding pin, but rather via a metal block which forms an angle, in particular a right angle, and which joins the printed circuit board and the lower surface of the package in this way.

The metal block is arranged adjacent to the one or more signal pin(s) thereby shielding them. The metal block is in particular in the form of a plate. In a preferred embodiment of the invention, the metal block is in the form of a bridge spanning the at least one signal pin.

Preferably, the metal block is formed as a solid metal part, for example made of copper. In another embodiment of the invention it is also conceivable to have a non-conductive material coated with a metal.

Another advantage of the metal block for a ground connection and at the same time for a mechanical connection is that the soldering of the pins, in particular of the signal pins, and the soldering of the ground connection are decoupled from each other.

In particular, if the TO package has two signal pins, they can first be attached to the printed circuit board. Since only the two signal pins are attached, a higher tolerance is given to positional tolerances than if a ground pin would be soldered at the same time.

Then, in the next step, a mechanically stable connection via ground can be established.

The printed circuit board is preferably in the form of a flexible printed circuit board. It may in particular be bent about 90°, for example to be plugged into a board.

Furthermore, according to one embodiment of the invention, the printed circuit board can be provided with a stiffener below the metal block.

The stiffener stabilizes the printed circuit board in the region of the metal block and furthermore enables easy attachment of the metal block on the printed circuit board, in particular by soldering.

According to one embodiment of the invention, the printed circuit board may be thickened adjacent to the lower surface of the TO package.

It is in particular contemplated that the thickened portion of the printed circuit board is in the form of a multi-layer board, in particular a rigid printed circuit board which merges into a flexible printed circuit board.

The thickened multi-layer portion may be used to provide additional connections, for example for a monitor diode.

Furthermore, the thickened portion may at the same time define the stiffener described above.

BRIEF DESCRIPTION OF THE DRAWINGS

The subject-matter of the invention will now be explained in more detail by way of exemplary embodiments and with reference to the drawings of FIGS. 1 through 18.

DETAILED DESCRIPTION

Figure 1:
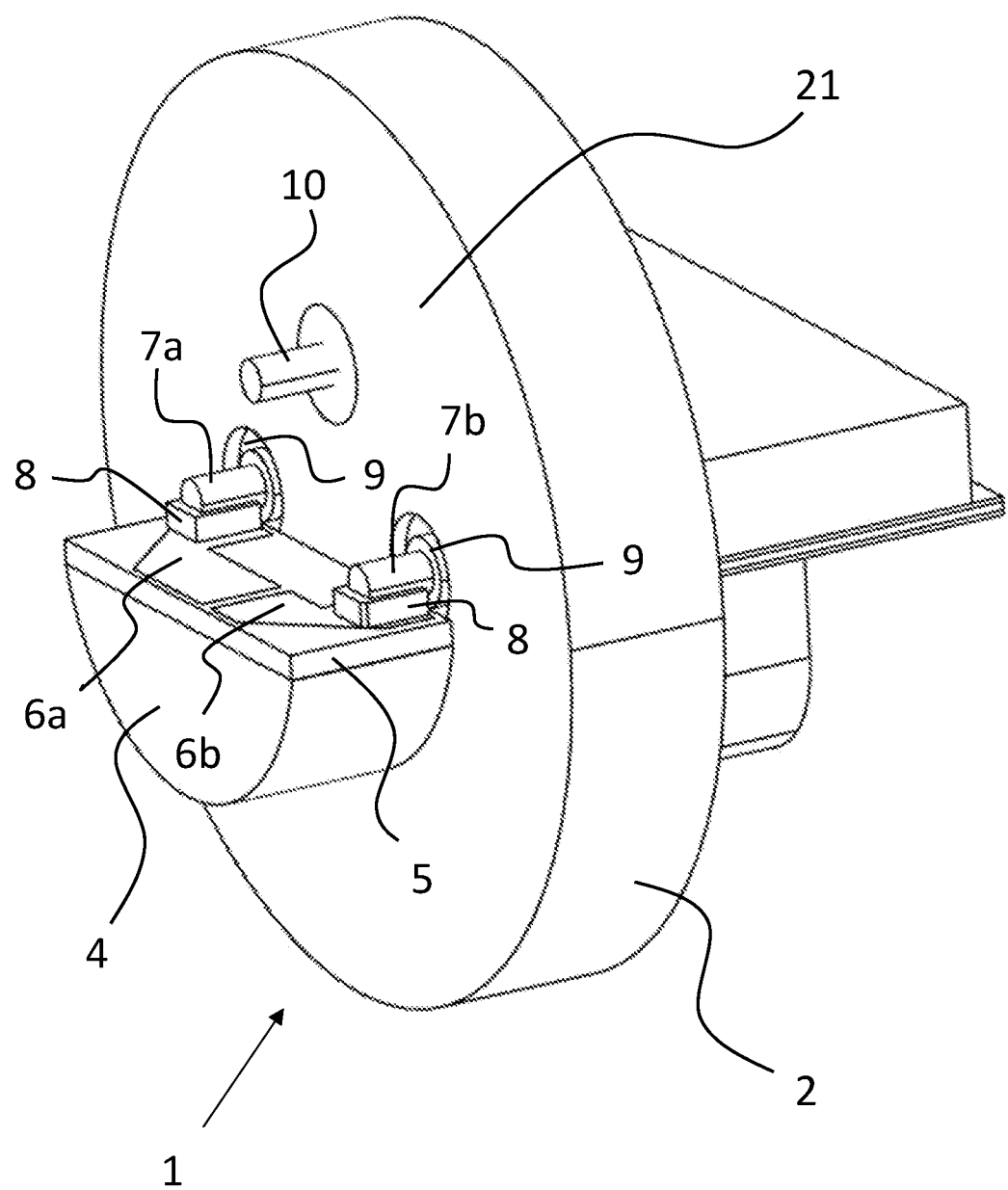
FIGS. 1 to 4 are perspective views of an exemplary embodiment of a TO package according to the invention (without cap).

FIG. 1 is a perspective view of a TO package 1 according to the invention.

TO package 1 comprises a header 2. In the present exemplary embodiment, the header 2 has a circular cross-sectional shape. Preferably, the header 2 is made of metal, in particular of a metal that is provided with a coating, for example a gold coating.

In this exemplary embodiment, the header 2 includes the two signal pins 7a, 7b which extend through the header 2 via feedthroughs 9.

The header 2 has an upper surface 21 which, once a cap has been attached, defines an inner surface of the then hermetically sealed TO package 1.

Signal pins 7a, 7b are connected to the conductor traces 6a, 6b by means of a solder 8.

Conductor traces 6a, 6b serve to electrically connect an optoelectronic component, in particular a laser diode (not shown). So, this exemplary embodiment of the invention is provided for a laser diode having two signal conductor paths.

Conductor traces 6a, 6b are provided on a submount 5 which in turn is mounted on a pedestal 4 that protrudes from the upper surface 21 of the header 2.

Preferably, the pedestal 4 is formed integrally with the header. Header 2 and pedestal 4 may in particular be formed as a one-piece stamped part.

In this exemplary embodiment, the pedestal 4 has a cross-sectional shape of a circular segment. However, it is also conceivable for the pedestal 4 to have a different design, for example with a rectangular cross-sectional shape.

Submount 5 is aligned coaxially with the signal pins 7a, 7b, so that in the assembled state the lower surface of the laser diode is aligned perpendicular to the upper surface 21 of the header 2.

Submount 5 is preferably made of a ceramic. For example an aluminum oxide ceramic may be used. Preferably, the submount 5 is made of an aluminum nitrite ceramic. The latter exhibits high thermal conductivity.

In addition to the signal pins 7a, 7b, the TO package 1 comprises at least one further pin 10 in this exemplary embodiment. This pin can be used for connecting a monitor diode, for example. It will be appreciated that other exemplary embodiments of the invention may include further pins, for example for driving a thermoelectric cooler (not shown).

Figure 2:
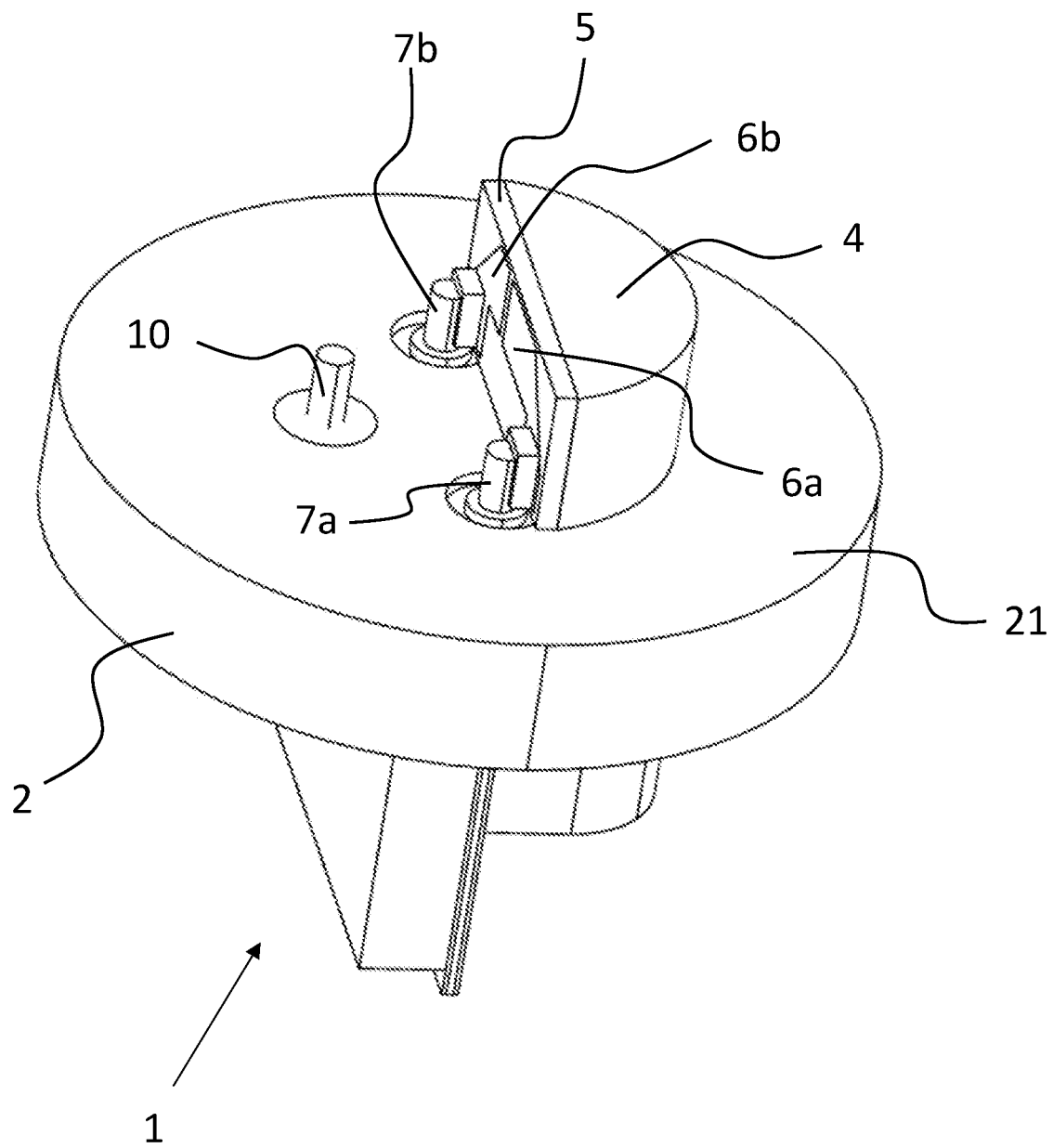

FIG. 2 is another perspective view of the TO package 1.

It can in particular be seen that the signal pins 7a, 7b and the pin 10 protrude perpendicularly from the upper surface of the header 2.

The same is true for the pedestal 4 with submount 5.

Signal pins 7a, 7b are combined coaxially to the conductor traces 6a, 6b. The conductor traces 6a and 6b on the submount 5 approach each other, so that an optoelectronic component can be placed directly on a conductor trace 6a and can be electrically connected to the other conductor trace 6b by a bonding wire.

Figure 3:
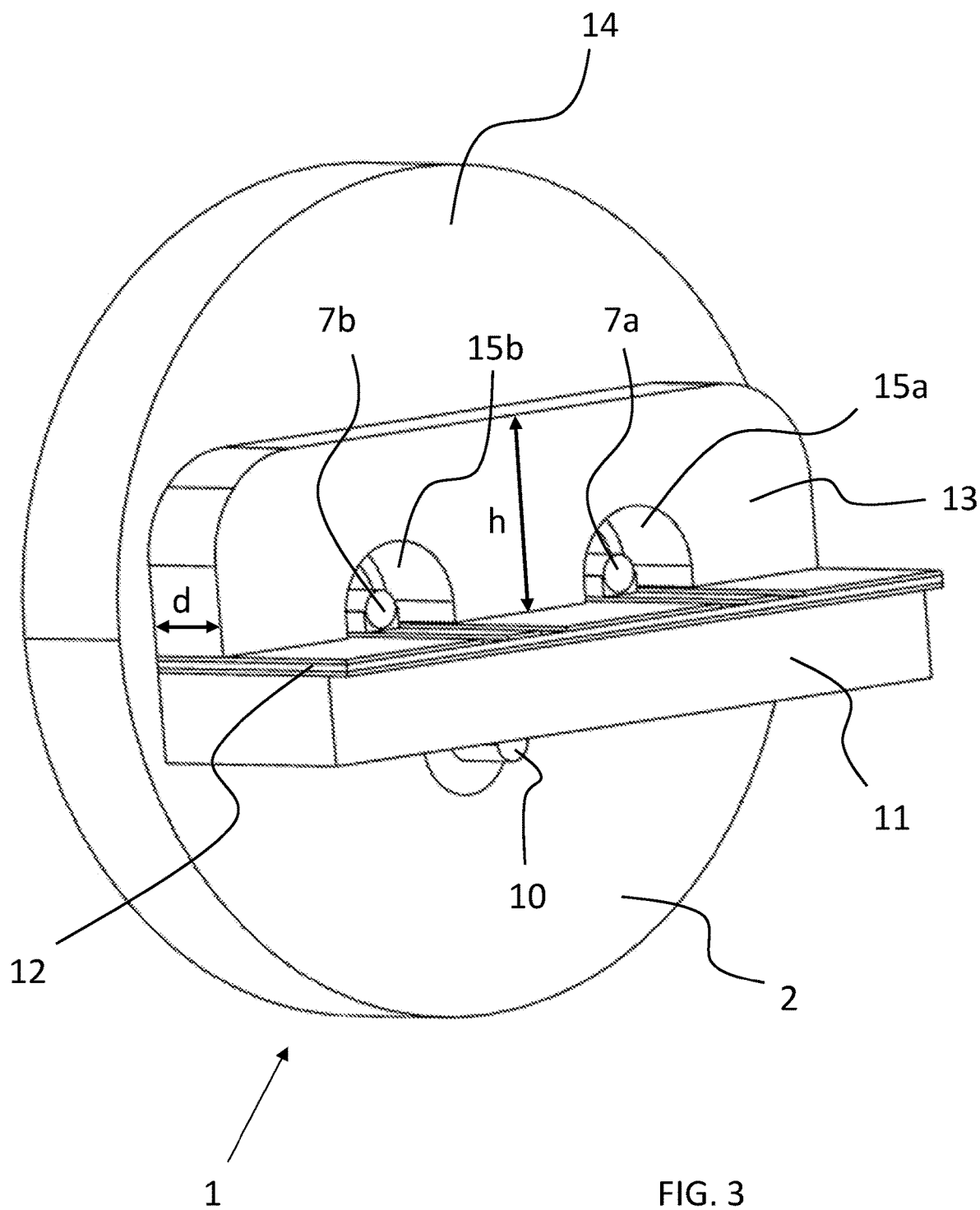

FIG. 3 is another perspective view of the TO package 1 illustrating the lower surface 14 of the TO package.

Signal pins 7a, 7b can be seen protruding from the lower surface 14.

Signal pins 7a, 7b are connected to a printed circuit board 12.

Printed circuit board 12 is only partially shown in this view. The printed circuit board 12 may, for example, be implemented as a flexible printed circuit board and may be angled to be connected to an electronic module (not shown).

Printed circuit board 12 is provided with a stiffener 11 on its lower surface. The stiffener 11 is preferably made of a dielectric material, for example of a plastic or ceramic material.

What is achieved with the stiffener 11 is, for example, that even a flexible printed circuit board 12 will be stiff and stable adjacent to the lower surface 14 of the header 2.

In order to establish a stable mechanical connection and a ground connection between the header 2 and the printed circuit board 12, a metal block 13 is provided and is connected, in particular soldered, to the printed circuit board 12 on the one side and to the lower surface 14 of the header 2 on the other side.

Metal block 13 defines an angle which allows for a coaxial arrangement of the printed circuit board 12 relative to the signal pins 7a, 7b.

In this exemplary embodiment, the metal block 13 is in the form of a bridge spanning each of the signal pins 7a, 7b with a respective arch 15a, 15b.

Signal pins 7a, 7b preferably do not project beyond the metal block 13.

Figure 8:
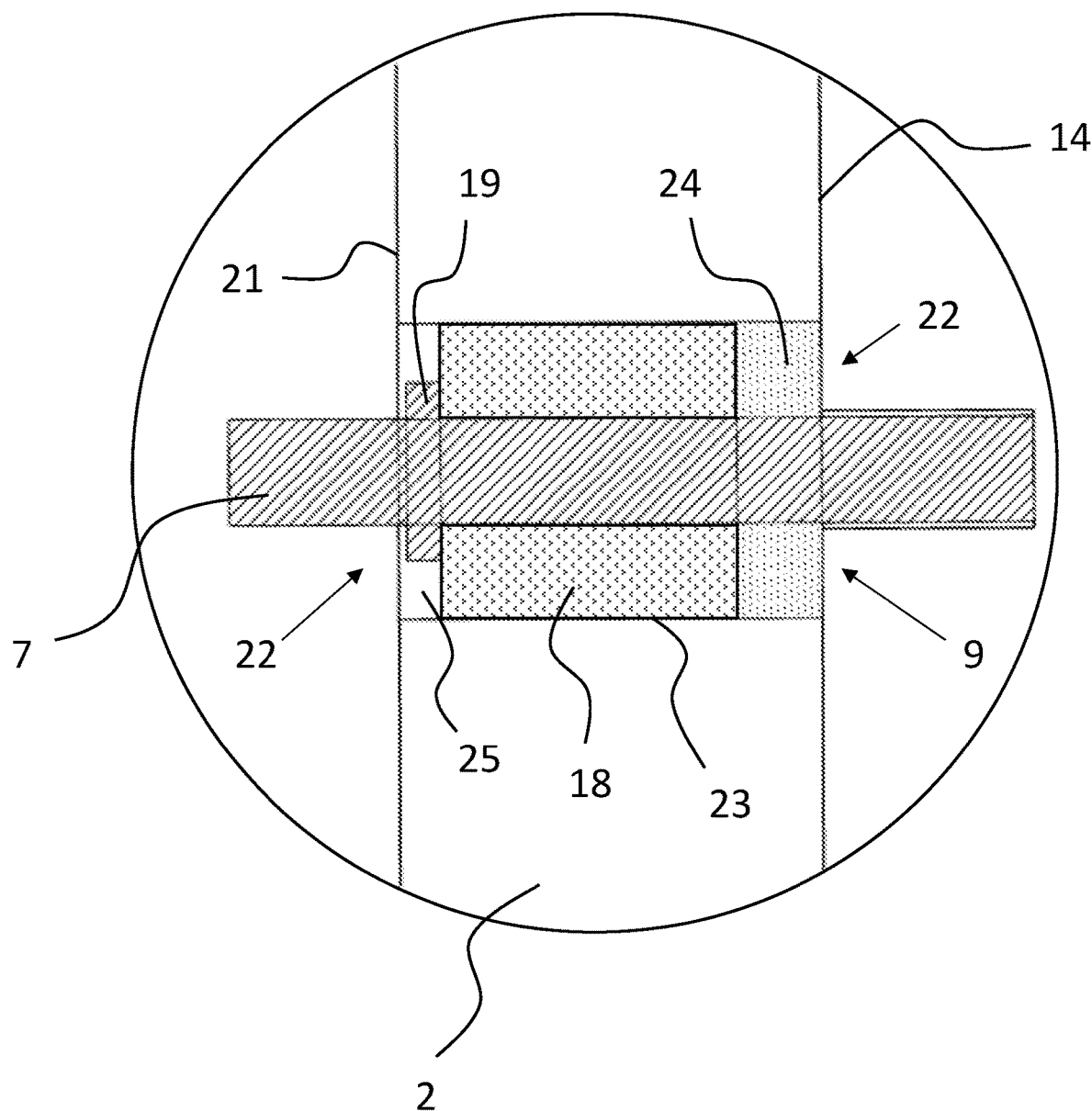
FIG. 8 is a sectional detail view through a feedthrough of the header.

In the region of the arches 15a, 15b, the metal block 13 may protrude into the range of the feedthrough (9 in FIG. 1 and FIG. 8).

With the metal block 13, signal pins 7a, 7b are also shielded outside the feedthrough.

Metal block 13 preferably has a plate-like shape.

Metal block 13 provides for a ground connection both between the signal pins 7a, 7b and next to the signal pins 7a, 7b.

Metal block 13 preferably has a thickness d of more than 0.1 mm, most preferably of more than 0.5 mm, and/or of less than 5 mm, most preferably of less than 2 mm.

In width direction, the metal block 13 may extend over a large part of the diameter of the header 2, in particular over at least 20%, preferably over at least 50% of the diameter of the header 2.

The height h of metal block 13 preferably corresponds to at least 1.5 times the diameter of the feedthrough.

In addition to providing a stable mechanical connection of the printed circuit board 12, the metal block 13 also has the advantage that the bonding of the signal pins 7a, 7b to the printed circuit board 12 is decoupled from the establishing of the ground connection.

Thus, the signal pins 7a, 7b may be soldered first to the printed circuit board 12, for example.

Since there will be no other mechanical connection to the printed circuit board 12 existing at this point in time, shape and positional tolerances can be well compensated for.

In the next step, the metal block 13 can be connected to the header 2 and/or to the printed circuit board 12 to establish a ground connection.

Furthermore, it can be seen that a further pin 10 is provided on the side of the printed circuit board 12 opposite the signal pins 7a, 7b. The further pin 10 is also disposed in a feedthrough and is used for connecting a monitor diode in this exemplary embodiment.

The further pin 10 is connected to the stiffener 11 which serves as a printed circuit board at the same time.

Figure 4:
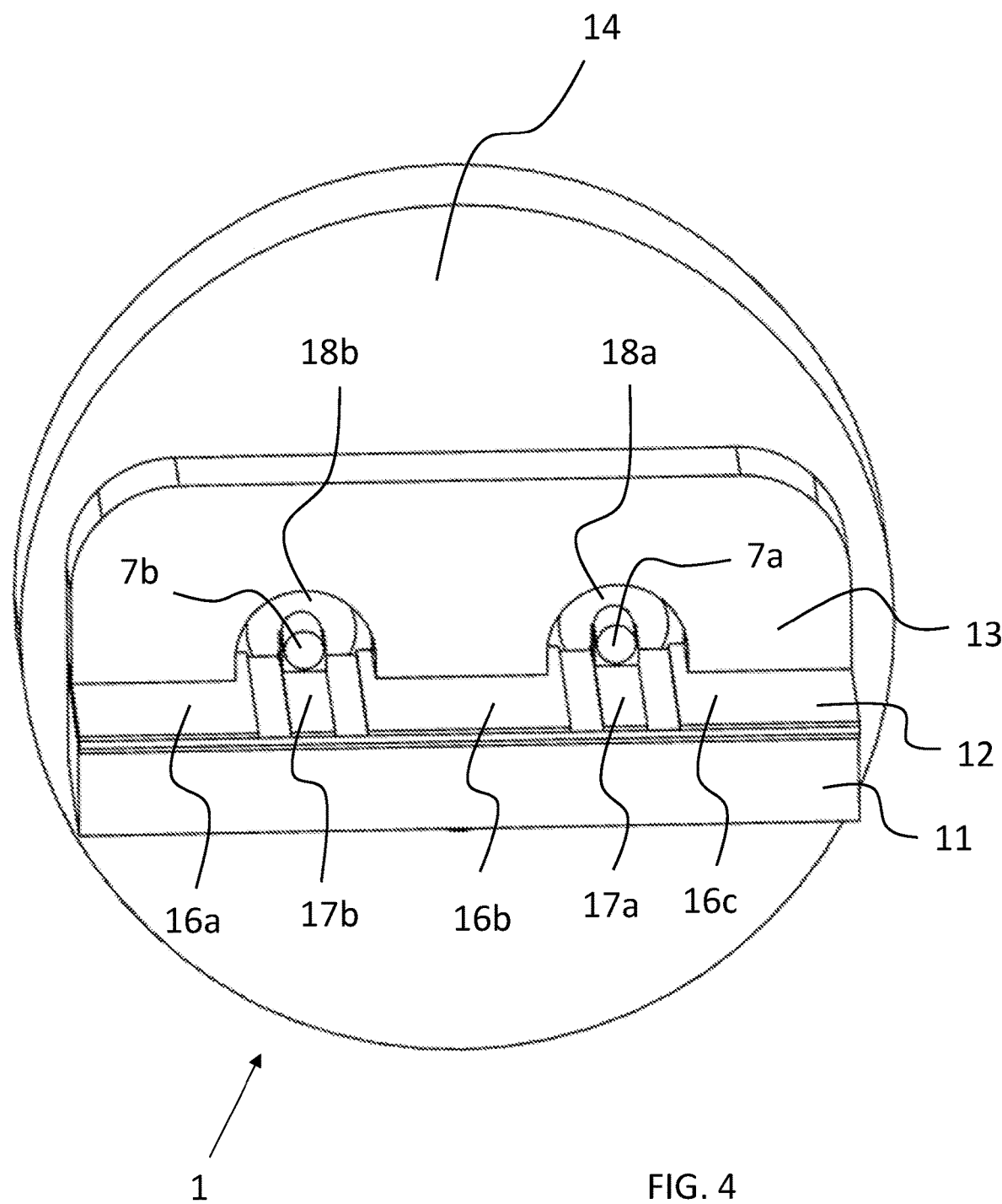

FIG. 4 is another perspective view of the lower surface 14 of the TO package.

It can be seen that the signal pins 7a, 7b are embedded in an insulating material made of glass 18a, 18b.

Signal pins 7a, 7b protrude from the lower surface 14 through the feedthroughs formed in this way.

The signal pins 7a, 7b are coaxially connected to signal conductor traces 17a, 17b of the printed circuit board 12.

Between signal conductor traces 17a, 17b on the printed circuit board 12, the ground conductor trace 16b is provided. Ground conductor traces 16a and 16c are arranged next to the signal conductor traces 17a, 17b on either side thereof. Thus, the signal conductor traces 17a, 17b are shielded from both sides.

Figure 5:
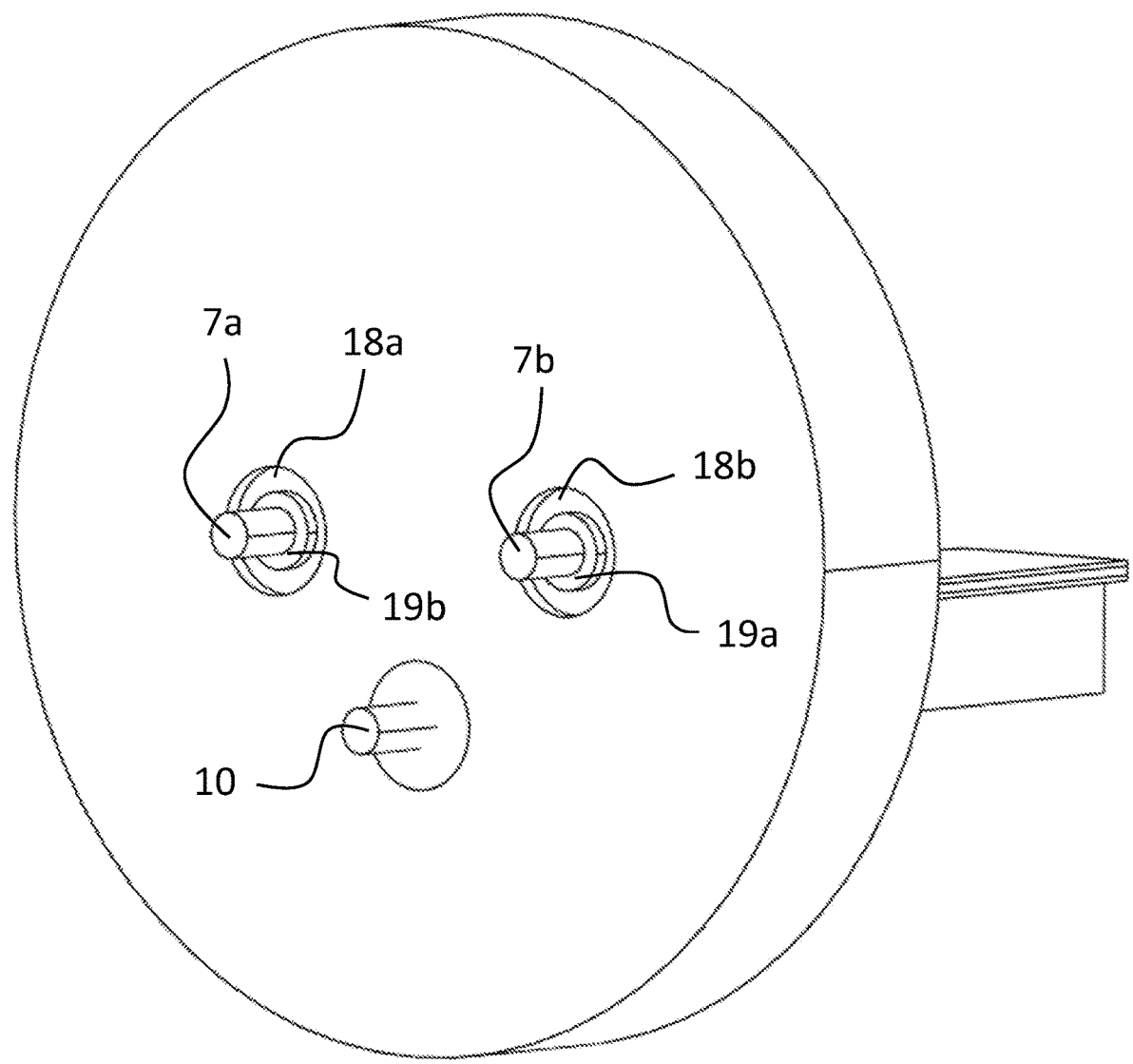
FIG. 5 is a perspective view of the inner surface of the package without submount.

FIG. 5 is a view of the inner surface of the TO package, in which the pedestal and the submount have been omitted.

It can be seen in this view that the signal pins 7a, 7b embedded in the insulating material made of glass 18a, 18b each have an enlarged portion 19a, 19b on the inner side. In the region of these collar-shaped enlarged portions 19a, 19b, there is an area without insulating glass material. The jump in impedance caused thereby is at least partially compensated for by the enlarged portions 19a, 19b.

Figure 6:
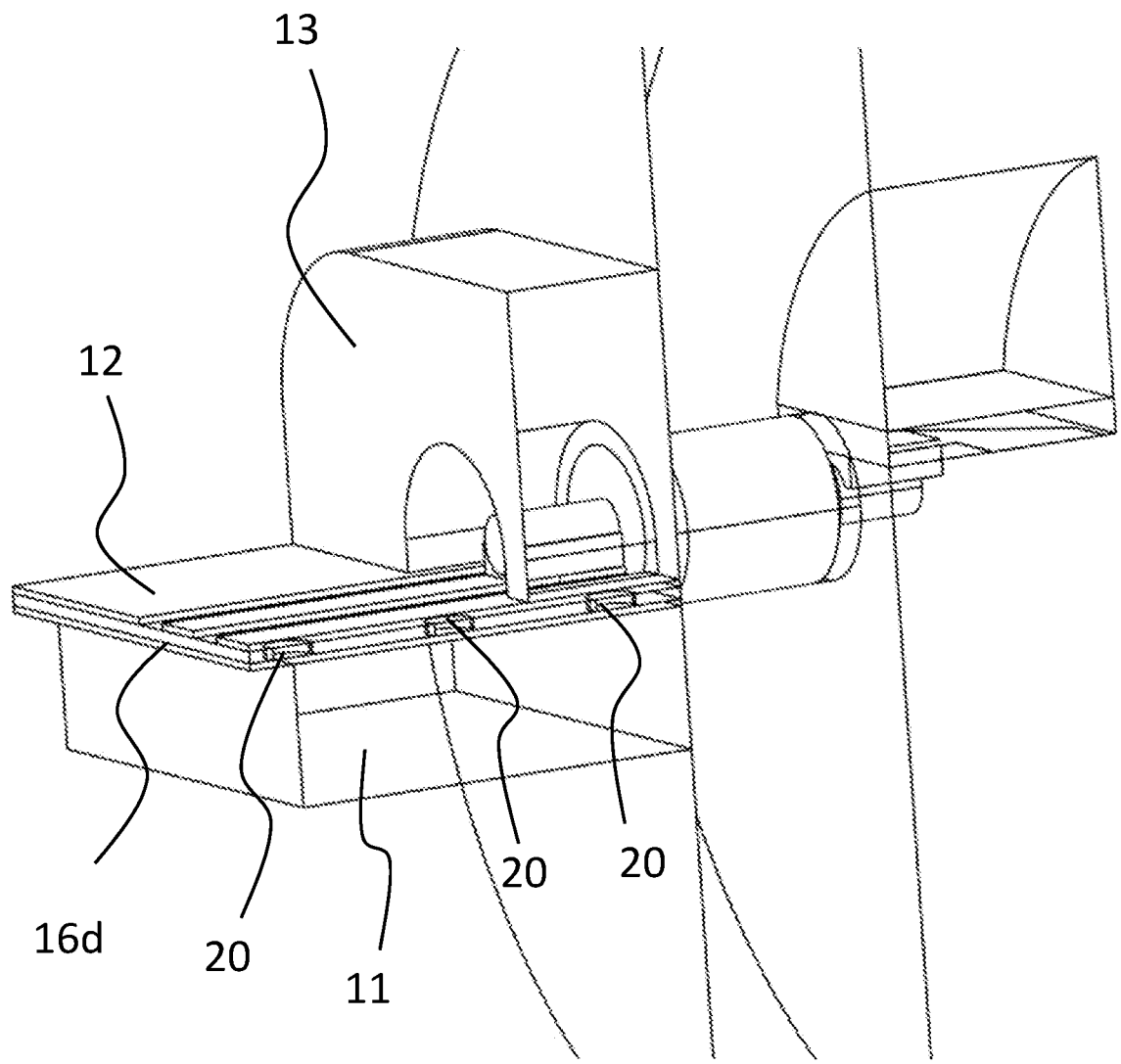
FIG. 6 is a detail view, partially cut away, which illustrates details of the printed circuit board.

FIG. 6 is a cutaway perspective view in which it can be seen that the printed circuit board 12 is configured as a multi-layer printed circuit board.

On the upper surface, the printed circuit board 12 comprises the signal conductor traces 17a, 17b illustrated in FIG. 4 and the ground conductor traces 16a to 16c.

Ground conductor traces 16a to 16c are connected, through vias 20, to an underlying ground conductor trace 16d which also extends below the signal conductor traces 17a, 17b shown in FIG. 4, thus shielding them.

The so configured multi-layer printed circuit board sits on the stiffener 11, and the ground conductor traces 16a to 16c are soldered to the metal block 13.

So, the stiffener 11 at the same time constitutes a thickened portion which forms a multi-layer printed circuit board across which a via is provided extending from the lower surface to the printed circuit board 12.

The multi-layer printed circuit board defined by the thickened portion or stiffener 11 is in the form of a rigid printed circuit board, whereas the printed circuit board 12 is preferably in the form of a single-layer flexible printed circuit board.

Thus, the further pin (10 in FIG. 3) can be connected on the lower surface of the stiffener 11, for connecting a monitor diode, for example.

Figure 7:
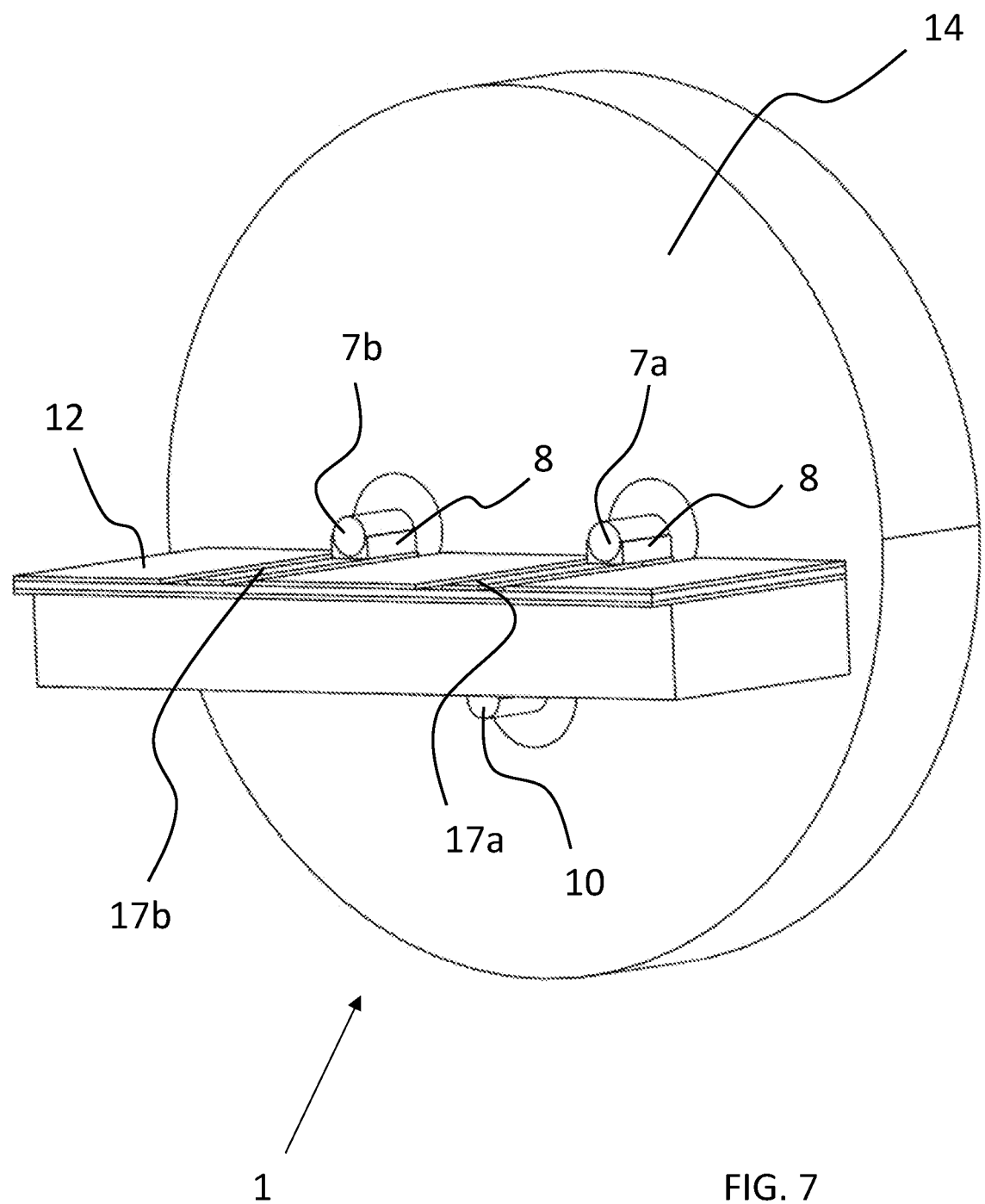
FIG. 7 is a perspective view of the lower surface of the header.

FIG. 7 is another perspective view of the lower surface of the TO package.

In this view, the metal block has been omitted. It can be clearly seen that the signal pins 7a, 7b protruding from the lower surface 14 are connected to the signal conductor traces 17a, 17b of the printed circuit board 12 by means of a solder 8.

FIG. 8 is a sectional view of a detail in the region of a feedthrough 9.

A signal pin 7 is disposed in the feedthrough 9 within an insulating material 18 made of glass.

For this purpose, the header 2 has a through-hole 23.

However, the feedthrough 9 or the through-hole 23 is only partially filled with the glass and/or glass ceramic insulating material 18, so that both adjacent to the lower surface 14 and adjacent to the upper surface 21 there is an area 22 free of the insulating material 18, which surrounds the signal pin 7 and which is not filled with the glass and/or glass ceramic insulating material.

On the inner side, a cavity 25 is existing in this non-filled area 22. Within the range of the cavity 25, an enlarged portion 19 of the signal pin 7 is provided.

Due to the enlarged portion 19 of the signal pin 7, the impedance jump caused by the changed permittivity is reduced.

On the outer side, the non-filled area 22 is filled with a plastic potting compound 24.

The plastic potting compound 24 preferably has a permittivity that is matched to the permittivity of the glass insulating material 18 that is used.

In particular, the plastic has a permittivity $\varepsilon_r$ of 4.0+/−2.5, more preferably +/−1.5.

A glass and/or glass ceramic that is preferably used as the glass or glass ceramic insulating material 18 has a permittivity $\varepsilon_r$ (at 18° C. and 50 Hz) of less than 5.0, preferably less than 4.0.

In particular a porous glass may be used, in particular a glass exhibiting a closed porosity of more than 30%, and/or a glass ceramic with these properties.

The signal pin preferably has a diameter from 0.1 to 0.5 mm, more preferably from 0.2 to 0.3 mm (except for the range of the enlarged portion 19).

The feedthrough 9 is preferably filled with the insulating material 18 made of glass and/or comprising glass ceramic in 50 to 90%, more preferably in 60 to 80% of its volume.

The enlarged portion 19 preferably has a diameter that is at least 1.2 times, in particular 1.5 to 2.5 times that of the adjacent portion of the signal pin 7.

In the present embodiment, the enlarged portion 19 has a length from 0.02 to 0.2 mm, preferably from 0.05 to 0.1 mm.

The length of the feedthrough 9 may in particular amount to 0.5 to 2 mm, preferably 0.8 to 1.5 mm.

Figure 9:
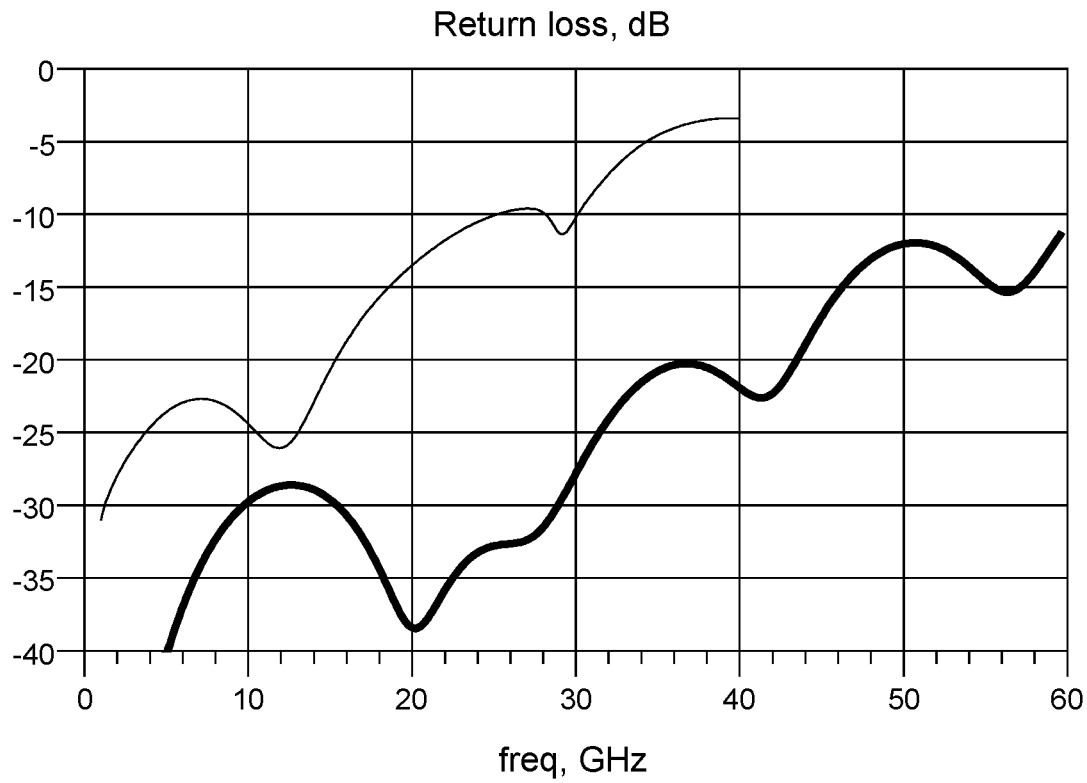
FIGS. 9 and 10 show graphs of return loss and insertion loss of the package illustrated in FIGS. 1 to 8 in comparison to a TO package known from the prior art.

FIG. 9 compares the return loss of a TO package known from the prior art (thin curve) with the return loss of a TO package according to the invention (thick curve). In particular, it can be seen that a return loss of about −10 dB has shifted from a frequency of about 30 GHz to about 50 GHz. So, the return loss is significantly improved.

Figure 10:
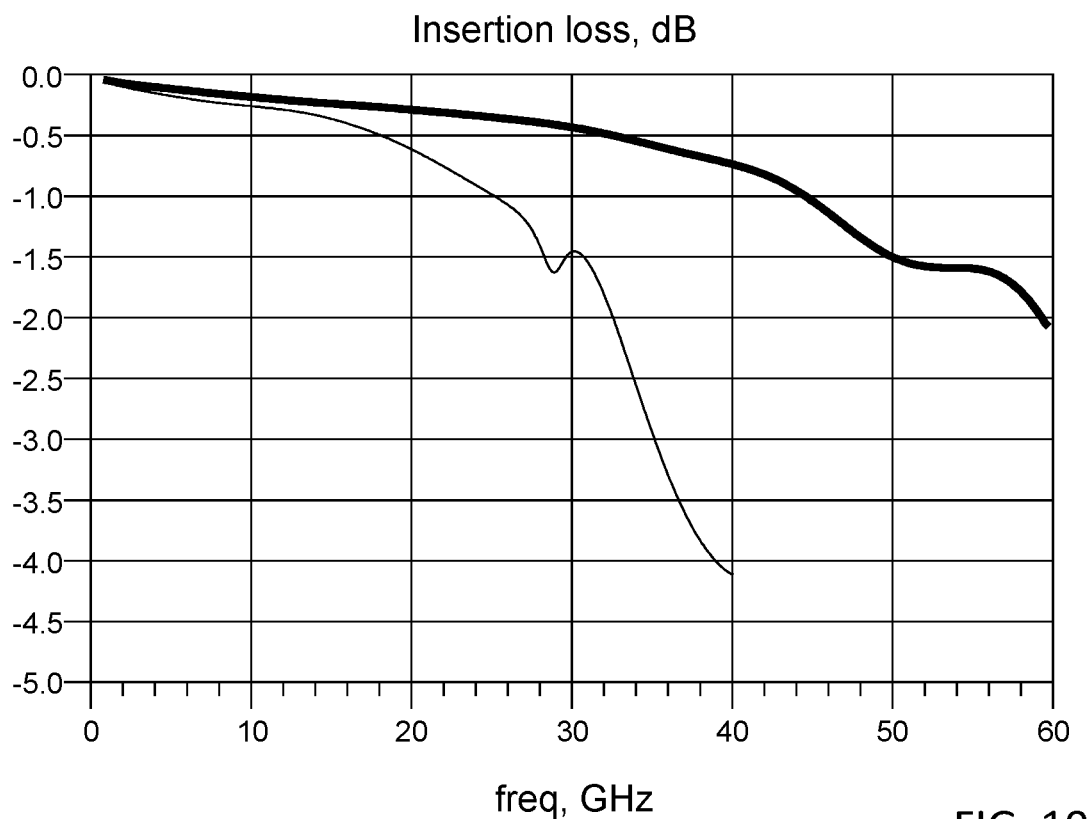

The same applies to the insertion loss, which is plotted for comparison in FIG. 10. An insertion loss of 2 dB is reached at just below 60 GHz instead of just over 30 GHz.

Thus, the invention enables to provide an approximately 25 GHz higher bandwidth.

Figure 11:
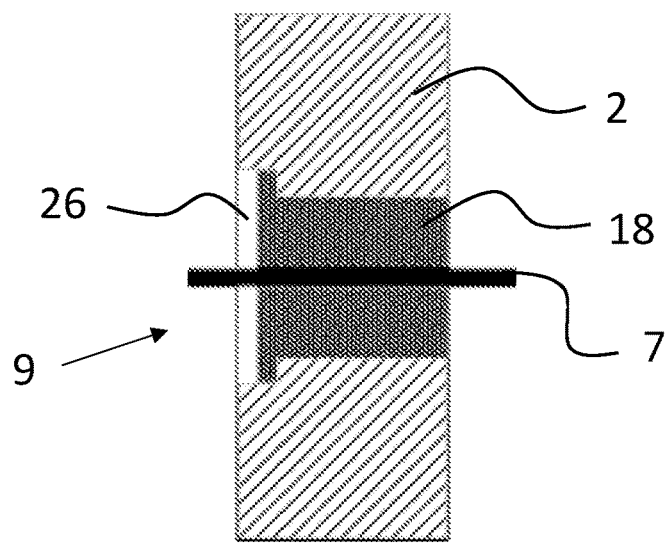
FIG. 11 is a sectional view of a feedthrough having an enlarged diameter on one side thereof.
Figure 12:
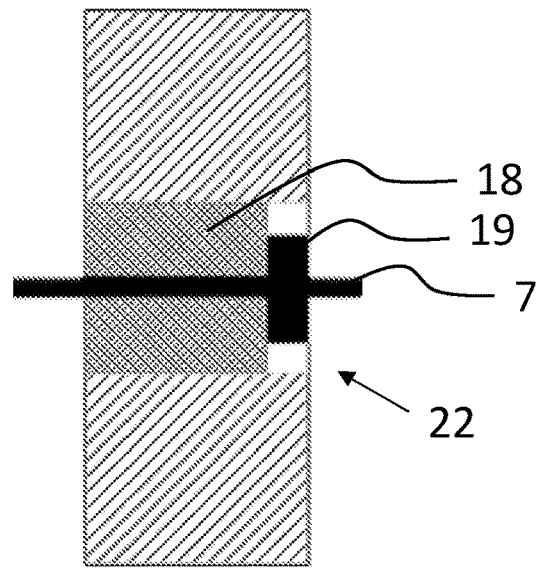
FIG. 12 is a sectional view of a feedthrough in which the signal pin has an enlarged portion on one side.
Figure 13:
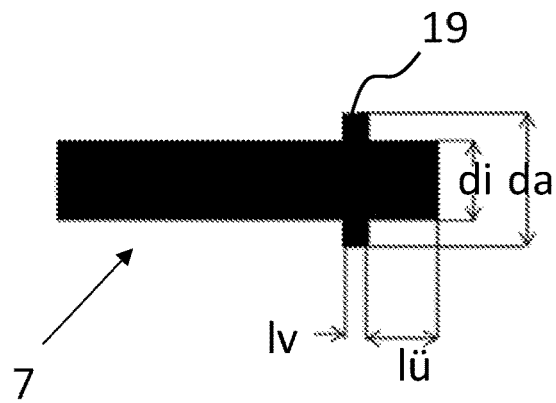
FIG. 13 is a detailed view of the signal pin.

Referring to FIGS. 11 to 13, further measures for adjusting the impedance profile of the feedthrough will be explained in greater detail.

FIG. 11 is a schematic sectional view of another exemplary embodiment of a feedthrough 9 introduced into the header 12.

In this exemplary embodiment, a signal pin 7 is again embedded in an insulating material 18 made of glass and/or glass ceramic. On at least one side, the feedthrough 9 includes an area 26 of enlarged diameter.

The area 26 of enlarged diameter is partially filled with the insulating material 18 made of glass and/or comprising glass ceramic.

The area 26 of enlarged diameter provides a reservoir which can accommodate variations in volume of the insulating material 18 made of glass.

Due to the enlarged diameter of area 26, however, the filling level will change only slightly in this case.

The insulating material 18 provided in the area 26 forms a mismatched disk which in turn reduces the impedance jump caused by the cavity thereabove.

The area of enlarged diameter preferably has a diameter that is at least 1.2 times that of the feedthrough 9 adjacent thereto, and has a length from 0.05 to 0.5 mm, preferably from 0.1 to 0.3 mm.

FIG. 12 shows another way of how impedance matching can be achieved, namely by providing the signal pin 7 with an enlarged portion 19 in the area 22 that is not filled with insulating material 18.

FIG. 13 is a detailed view of the signal pin 7.

In the not enlarged portion, the signal pin 7 has a diameter $d_i$ of preferably between 0.1 and 0.5 mm, most preferably between 0.2 and 0.3 mm.

In the present embodiment, the enlarged portion 19 has a stepped shape, i.e. it defines a circular cylindrical portion.

However, the enlarged portion 19 may also have a different shape, in particular it may have a chamfer at the front and/or rear end. In this way, the enlarged portion 19 would merge into the largest diameter $d_o$ not abruptly but gradually. This implies a gradually changing impedance profile.

The enlarged portion 19 has a diameter $d_o$ which preferably corresponds to at least 1.2 times the diameter $d_i$, more preferably 1.5 to 2.5 times the diameter $d_i$.

The enlarged portion 19 preferably has a length $l_e$ from 0.02 to 0.2 mm, more preferably from 0.05 to 0.1 mm.

The length of the adjoining projection $l_p$ is preferably from 0.2 to 0.5 mm.

Figure 14:
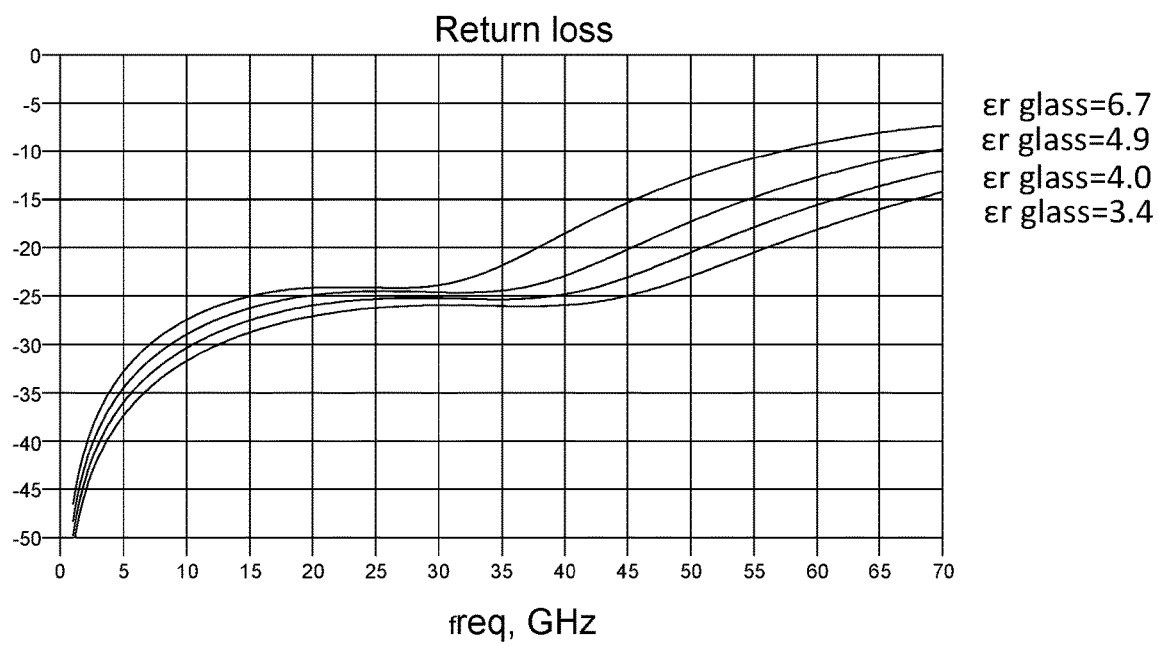
FIG. 14 shows graphs of return loss of a TO package according to the invention using different types of glass.

The graph of FIG. 14 shows the return loss of an exemplary embodiment of the invention in which a feedthrough was filled with a respective insulating material made of glass having a different permittivity.

It can be seen that the return loss improves the lower the permittivity of the glass insulating material is.

Figure 15:
FIG. 15 shows graphs of return loss of a TO package according to the invention, in which the feedthrough is filled partly with glass, partly with a plastic material, using different types of glass and plastics.

FIG. 15 shows the return loss of a TO package according to the invention when different glasses are used as the insulating material and when different fillings are used for the area of the feedthrough without glass.

It can be seen that the return loss without filling ($\varepsilon_r$ filling=1 and $\varepsilon_r$ glass=6.5) is the worst.

Optimum return loss can be achieved by using a glass of low permittivity and at the same time using a filling that has a permittivity which is matched to the permittivity of the glass.

Figure 16:
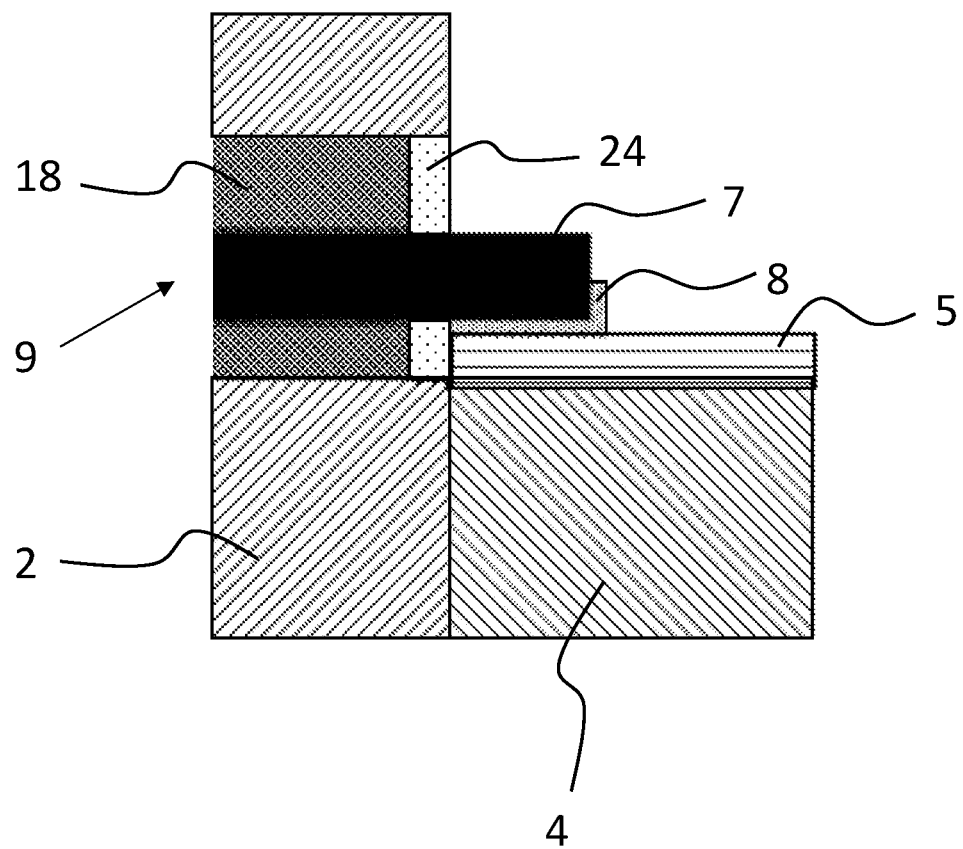
FIG. 16 is a sectional view of an exemplary embodiment of a header in the region of the feedthrough of the signal pin and of the submount for the optoelectronic component.

Referring to FIG. 16, it will be explained with reference to a schematic sectional view how a signal pin can be introduced eccentrically into the feedthrough 9, for the purpose of impedance matching and/or for use of a thinner submount 5.

In this exemplary embodiment, a signal pin 7 is provided embedded in an insulating material 18 made of glass or glass ceramic, and the signal pin is connected to the submount 5 placed on pedestal 4 by means of a solder 8.

Feedthrough 9 is only partially filled with the insulating material 18 made of glass.

Adjoining the glass insulating material 18, a recessed area is filled with a plastic potting compound 24.

It can be seen that the signal pin 7 is disposed in the feedthrough 9 in eccentric manner so as to be offset toward the submount 5.

The submount 5 preferably has a thickness from 0.05 to 2 mm, more preferably from 0.1 to 0.2 mm. The submount is preferably made of a ceramic, in particular of aluminum oxide or aluminum nitrite.

The central axis of the signal pin is preferably offset from the central axis of the feedthrough 9 by 0.01 to 0.15 mm, most preferably by 0.02 to 0.08 mm.

Submount 5 protrudes into the range of feedthrough 9, but is spaced from the signal pin 7 to allow solder 8 to flow in.

The spacing between the signal pin 7 and the submount 5 is preferably between 0.05 and 0.3 mm, more preferably between 0.1 and 0.2 mm.

Figure 17:
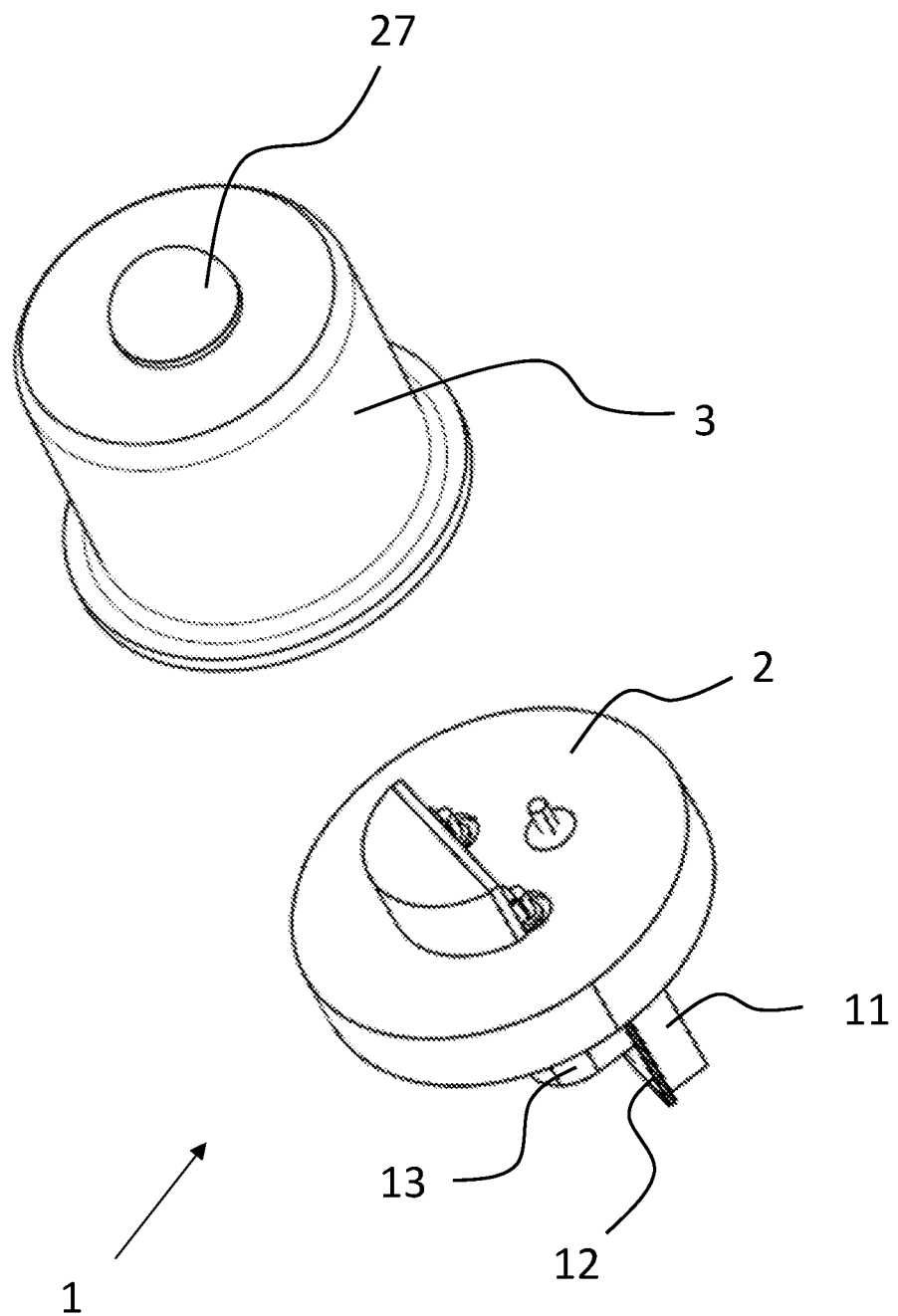
FIG. 17 is a perspective view of a TO package with cap.

FIG. 17 shows a perspective view of a kit for forming a TO package 1.

TO package 1 consists of header 2 and cap 3 in which a window 27 is provided.

Window 27 is in particular in the form of a lens.

The header 2 may be equipped with an optoelectronic module, for example a laser diode and a monitor diode. Subsequently, the cap 3 is applied to the header, e.g. soldered or welded thereto.

Metal block 13 and printed circuit board 12 provided with the stiffener 11 may be attached after the cap 3 has been applied by soldering.

As described above, it is advantageous here that the connecting of signal pins is decoupled from the establishing of a ground connection.

Figure 18:
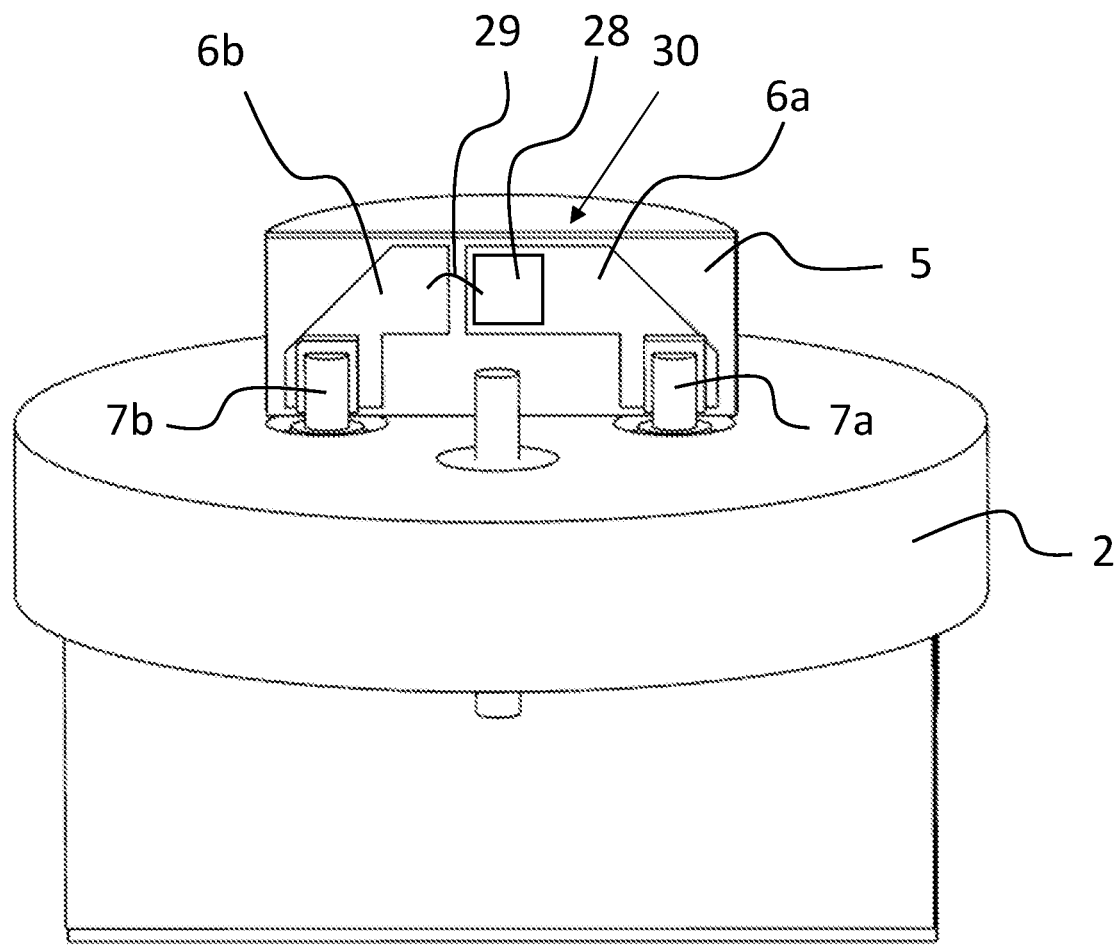
FIG. 18 shows the TO package equipped with an optoelectronic component.

FIG. 18 is a schematic view showing how the TO package is equipped with a laser diode 28.

On submount 5, a mounting area 30 is provided.

In the present exemplary embodiment, the laser diode 28 is placed on the conductor trace 6a provided on the submount 5 and is thus connected to signal pin 7a.

In order to be electrically connected to signal pin 7b, a bonding wire 29 is provided connecting the laser diode 28 to the conductor trace 6b.

Since conductor traces 6a and 6b directly face each other, the length of the bonding wire 29 can be kept short, in particular at less than 0.5 mm.

Figure 19:
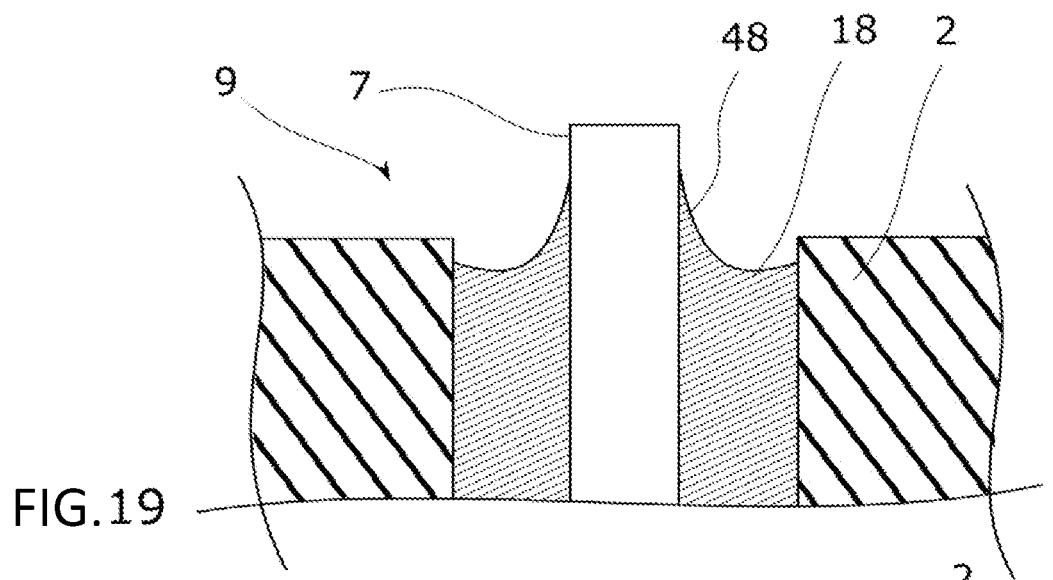
FIG. 19 to FIG. 21 show schematic sectional views of headers with feedthroughs.
Figure 20:
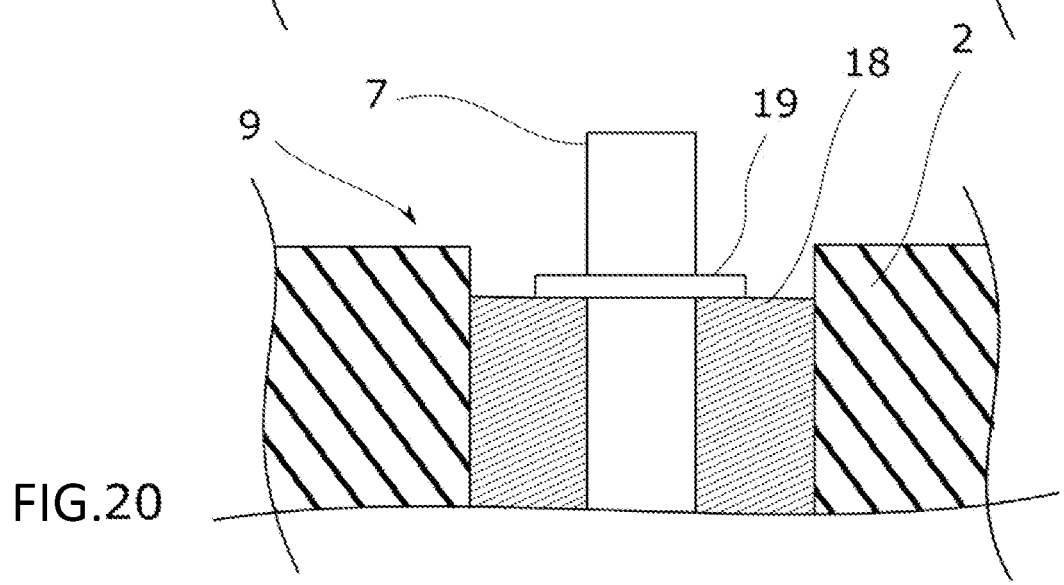
Figure 21:
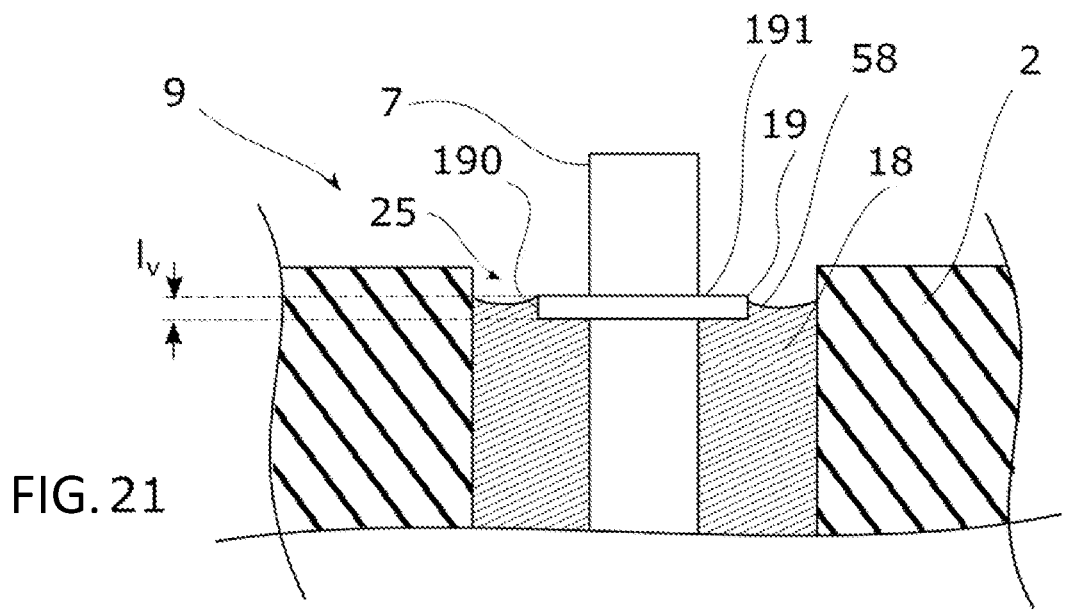

FIG. 19 to FIG. 21 show schematic sectional views of headers with feedthroughs. FIG. 19 shows the case of an insulation of feedthrough 9, fitted in glass. When fusing the glass, a glass metal sealing may appear at signal pin 7. This influences the impedance and complicates putting a submount on. The enlarged portion 19 inside the cavity 25, in the form of a deepening in the feedthrough 9 may effectively hinder that. The example of FIG. 20 shows the ideal case. Here, the insulation material ends at the lower side of enlarged portion 19 so that the enlarged portion is completely in the portion not filled with insulation material, in axial direction.

FIG. 21 shows a typical real case. The insulation material made of glass covers the lateral area 190 of the enlarged portion 19, partially or completely. But at least the outward pointing front surface 191 of the enlarged portion remains free of insulation material. The covering is complicated by the angle between the lateral surface 190 and the front surface 191. A glass metal sealing like in the example of FIG. 19 is thereby prevented. Covering the lateral surface 190 may cause an impedance jump, but this is low and tolerable, provided that the axial length $l_v$ of the enlarged portion is less than the wave length of the transmitted signals. This feature is generally in particular also achieved by the length $l_v$ of the enlarged portion 18 being less in axial direction than its maximal lateral dimension in radial direction of feedthrough 9. In the preferred case of an enlarged portion being circular, when views in axial direction, this maximal lateral dimension of the enlarged portion is then accordingly given by the diameter of the enlarged portion. If this criterion is fulfilled, the enlarged portion has a plate, disk or collar-like shape. As stated, also a covering and therewith a complete embedding of the enlarged portion 19 in the insulation material 18 is avoided, by the form with a lateral surface 190 and a front a surface 191. According to another refinement, it is therefore provided that the enlarged portion 19 has a lateral surface 190 which, if needed is at least partially embedded in the insulation material 18, wherein the enlarged 19 additionally has a front surface pointing outward which at least partially remains free of insulation material, and thereby confines the cavity 25, or respectively forms a part of the wall of cavity 25.

The invention permitted to provide, in a simple manner, a TO package 1 which allows for significantly higher data transfer rates.

LIST OF REFERENCE NUMERALS

| | |
|---|---|
| 1 | TO package |
| 2 | Header |
| 3 | Cap |
| 4 | Pedestal |
| 5 | Submount |
| 6a, 6b | Submount conductor traces |
| 7, 7a, 7b | Signal pin |
| 8 | Solder |
| 9 | Feedthrough |
| 10 | Pin |
| 11 | Stiffener, thickened area |
| 12 | Printed circuit board |
| 13 | Metal block |
| 14 | Lower surface |
| 15a, 15b | Arch |
| 16a-16d | Ground conductor traces |
| 17a, 17b | Signal conductor trace |
| 18, 18a, 18b | Insulating material |
| 19, 19a, 19b | Enlarged portion of signal pin |
| 20 | Via |
| 21 | Upper surface of header |
| 22 | Area not filled with filling material |
| 23 | Through-hole of header |
| 24 | Plastic potting compound |
| 25 | Cavity |
| 26 | Area of enlarged diameter |
| 27 | Window |
| 28 | Laser diode |
| 29 | Bonding wire |
| 30 | Mounting area |
| 48 | glass metal sealing |
| 58 | surface |
| 190 | lateral surface |

What is claimed is:

1. A transistor outline package, comprising:
a header with a mounting area for an optoelectronic component,
wherein the header comprises a signal pin in a feedthrough,
wherein the feedthrough is filled with an insulating material comprising glass and/or glass ceramic, and the feedthrough has a recessed area on at least one side that is not completely filled up with the insulating material,
wherein the recessed area defines a cavity at least partially around the signal pin, and
wherein the signal pin has an enlarged portion in the recessed area, wherein the signal pin has a first diameter, and the enlarged portion is a collar that has a second diameter that is larger than the first diameter.

2. The transistor outline package of claim 1, wherein the feedthrough is filled with the insulating material to between 30 to 95% of a total volume.

3. The transistor outline package of claim 1, wherein the feedthrough is filled with the insulating material to between 60 to 80% of a total volume.

4. The transistor outline package of claim 1, wherein the recessed area is filled with a plastic.

5. The transistor outline package of claim 4, wherein the plastic has a permittivity at 18° C. and 50 Hz that is within +/−1.0 of a permittivity of the insulating material.

6. The transistor outline package of claim 4, wherein the plastic has a permittivity at 18° C. and 50 Hz of 4.0+/−2.5.

7. The transistor outline package of claim 1, wherein the insulating material is made of or comprises a porous glass and/or a porous glass ceramic.

8. The transistor outline package of claim 7, wherein the enlarged portion has a length from 0.02 to 0.2 mm.

9. The transistor outline package of claim 1, wherein the enlarged portion has a diameter that is 1.2 to 3.0 times that of the signal pin adjoining the insulating material.

10. The transistor outline package of claim 9, wherein the enlarged portion has a length from 0.02 to 0.2 mm.

11. The transistor outline package of claim 1, wherein the feedthrough includes an area of enlarged diameter on at least one side thereof.

12. The transistor outline package of claim 11, wherein the area of enlarged diameter is partially filled with the insulating material.

13. The transistor outline package of claim 11, wherein the area of enlarged diameter has a diameter that is 1.2 times a diameter of the feedthrough and/or has a length from 0.05 to 0.5 mm.

14. A device for data transfer at a data transfer rate of at least 100 Gbit/s per wavelength, comprising the transistor outline package of claim 1.

15. A transistor outline package, comprising:
a header with a mounting area for an optoelectronic component,
wherein the header comprises a signal pin in a feedthrough,
wherein the feedthrough is filled with an insulating material comprising glass and/or glass ceramic, and the feedthrough has a recessed area on at least one side that is not completely filled up with the insulating material,
wherein the recessed area defines a cavity at least partially around the signal pin,
wherein the signal pin has an enlarged portion in the recessed area, and
wherein the insulating material has a permittivity at 18° C. and 50 Hz of less than 5.0.

16. A transistor outline package, comprising:
a header with a mounting area for an optoelectronic component, wherein the header comprises a signal pin disposed in a feedthrough, wherein the feedthrough is filled with an insulating material comprising glass and/or glass ceramic, and the feedthrough having a recessed area on at least one side that is not completely filled up with the insulating material, wherein the recessed area defines a cavity at least partially around the signal pin, and wherein the signal pin has an enlarged portion in the recessed area; and
a printed circuit board attached on the signal pin substantially coaxially thereto.

17. The transistor outline package of claim 16, wherein the printed circuit board is mechanically and electrically connected to the header by at least one metal block arranged adjacent to the feedthrough to provide grounding.

18. The transistor outline package of claim 16, wherein the printed circuit board is in the form of a flexible printed circuit board and/or wherein the printed circuit board is provided with a stiffener below the metal block.

19. The transistor outline package of claim 16, wherein the signal pin comprises two signal pins each one arranged in a different feedthrough.

20. The transistor outline package of claim 16, wherein the printed circuit board is thickened adjacent to the lower surface, wherein the printed circuit board has a thickened multi-layer portion.

21. A transistor outline package, comprising:
a header with a mounting area for an optoelectronic component,
wherein the header comprises a signal pin in a feedthrough,
wherein the feedthrough is filled with an insulating material comprising glass and/or glass ceramic, and the feedthrough has a recessed area on at least one side that is not completely filled up with the insulating material,
wherein the recessed area defines a cavity at least partially around the signal pin, and
wherein the signal pin has an enlarged portion in the recessed area, wherein the signal pin has a first diameter, and the enlarged portion is a collar having a stepped shape that has a second diameter that is larger than the first diameter.

* * * * *